United States Patent
Liu et al.

(10) Patent No.: US 9,048,867 B2
(45) Date of Patent: Jun. 2, 2015

(54) SHIFT REGISTER-BASED LAYERED LOW DENSITY PARITY CHECK DECODER

(71) Applicant: LSI Corporation, San Jose, CA (US)

(72) Inventors: Dan Liu, Shanghai (CN); Qi Zuo, Shanghai (CN); Chung-Li Wang, San Jose, CA (US); Zongwang Li, San Jose, CA (US); Lei Wang, Shanghai (CN)

(73) Assignee: LSI Corporation, San Jose, CA (US)

( * ) Notice: Subject to any disclaimer, the term of this patent is extended or adjusted under 35 U.S.C. 154(b) by 178 days.

(21) Appl. No.: 13/898,685

(22) Filed: May 21, 2013

(65) Prior Publication Data

US 2014/0351671 A1  Nov. 27, 2014

(51) Int. Cl.
*H03M 13/11* (2006.01)
*H04L 1/00* (2006.01)

(52) U.S. Cl.
CPC ...... *H03M 13/1105* (2013.01); *H03M 13/1117* (2013.01); *H03M 13/1114* (2013.01); *H03M 13/1162* (2013.01); *H03M 13/1131* (2013.01); *H03M 13/1122* (2013.01); *H03M 13/114* (2013.01); *H03M 13/1171* (2013.01); *H04L 1/005* (2013.01); *H03M 13/112* (2013.01); *H03M 13/1174* (2013.01)

(58) Field of Classification Search
CPC ............... H03M 13/1114; H03M 13/1117; H03M 13/1122; H03M 13/1131; H03M 13/1105; H03M 13/1162; H03M 13/114; H03M 13/112; H03M 13/1174; H03M 13/1171; H04L 1/005
USPC .......... 714/752, 758, 755, 781, 786, 780, 799
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |

(Continued)

OTHER PUBLICATIONS

Baek et al., A High-Throughput LDPC Decoder Architecture for High-Rate WPAN Systems, 2011, IEEE, pp. 1311-1314.*

(Continued)

*Primary Examiner* — John J Tabone, Jr.
(74) *Attorney, Agent, or Firm* — Hamilton DeSanctis & Cha

(57) ABSTRACT

An apparatus for layered low density parity check decoding includes a variable node processor and a check node processor. The variable node processor is operable to generate variable node to check node messages and to calculate perceived data values based on check node to variable node messages. The check node processor includes an intermediate message generator circuit operable to generate intermediate check node messages, a shift register based memory operable to store the intermediate check node messages, and at least one check node to variable node message generator circuit operable to generate the check node to variable node messages based on the intermediate check node messages from the shift register based memory.

20 Claims, 6 Drawing Sheets

(56) References Cited

U.S. PATENT DOCUMENTS

| | | |
|---|---|---|
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar et al. |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,243,287 B2 * | 7/2007 | Cameron et al. ............. 714/752 |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 * | 7/2010 | Chaichanavong et al. .... 714/755 |
| 7,779,325 B2 | 8/2010 | Song |
| 7,802,163 B2 * | 9/2010 | Tan ............. 714/752 |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,074,142 B2 * | 12/2011 | Kamiya ............. 714/752 |
| 8,201,049 B2 * | 6/2012 | Lu ................ 714/755 |
| 8,201,051 B2 | 6/2012 | Tan |
| 8,237,597 B2 | 8/2012 | Liu |
| 8,261,171 B2 | 9/2012 | Annampedu |
| 8,266,493 B1 * | 9/2012 | Abbaszadeh et al. ........ 714/752 |
| 8,291,284 B2 | 10/2012 | Savin |
| 8,295,001 B2 | 10/2012 | Liu |
| 8,566,666 B2 * | 10/2013 | Wang et al. ............. 714/758 |
| 8,707,144 B2 * | 4/2014 | Wang et al. ............. 714/784 |
| 8,775,896 B2 * | 7/2014 | Li et al. ............. 714/758 |
| 8,819,515 B2 * | 8/2014 | Chen et al. ............. 714/752 |
| 2006/0195754 A1 * | 8/2006 | Shen et al. ............. 714/752 |
| 2007/0094568 A1 * | 4/2007 | Choi et al. ............. 714/758 |
| 2008/0069373 A1 | 3/2008 | Jiang |
| 2008/0304558 A1 | 12/2008 | Zhu et al. |
| 2008/0307292 A1 * | 12/2008 | Gaudet et al. ............. 714/786 |
| 2009/0132893 A1 | 5/2009 | Miyazaki |
| 2009/0185643 A1 | 7/2009 | Fitzpatrick |
| 2009/0217125 A1 * | 8/2009 | Liu ............. 714/752 |
| 2009/0276682 A1 * | 11/2009 | Lakkis ............. 714/752 |
| 2009/0304111 A1 * | 12/2009 | Shinya et al. ............. 375/316 |
| 2010/0037121 A1 * | 2/2010 | Jin et al. ............. 714/763 |
| 2010/0153810 A1 * | 6/2010 | Kamiya ............. 714/752 |
| 2010/0268918 A1 * | 10/2010 | Priewasser et al. .......... 712/208 |
| 2011/0161770 A1 * | 6/2011 | Ueng et al. ............. 714/752 |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |
| 2013/0091399 A1 * | 4/2013 | Hu et al. ............. 714/752 |
| 2013/0156133 A1 * | 6/2013 | Gentile et al. ............. 375/340 |
| 2014/0053037 A1 * | 2/2014 | Wang et al. ............. 714/752 |
| 2014/0101510 A1 * | 4/2014 | Wang et al. ............. 714/758 |
| 2014/0201594 A1 * | 7/2014 | Zhu et al. ............. 714/758 |
| 2014/0281786 A1 * | 9/2014 | Ueng et al. ............. 714/752 |

OTHER PUBLICATIONS

Wang et al., A New Min-Sum Based Decoding Algorithm for Non-Binary LDPC Codes, Fe. 2, 2012, IEEE, pp. 476-480.*

Chen et al., Efficient Configurable Decoder Architecture for Non-binary Quasi-cyclic LDPC Codes, 2011, IEEE, pp. 1-10.*

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

(56) References Cited

OTHER PUBLICATIONS

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsši: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/174,537, Unpublished (filed Jun. 30, 2011) (Anantha Raman Krishnan).
U.S. Appl. No. 13/284,730, Unpublished (filed Oct. 28, 2011) (Fan Zhang).
U.S. Appl. No. 13/886,103, Unpublished (filed May 2, 2013) (Chung-Li Wang).
U.S. Appl. No. 13/269,832, Unpublished (filed Oct. 10, 2011) (Haitao Xia).
U.S. Appl. No. 13/239,683, Unpublished (filed Sep. 22, 2011) (Changyou Xu).
U.S. Appl. No. 13/186,234, Unpublished (filed Jul. 19, 2011) (Haitao Xia).
U.S. Appl. No. 13/213,751, Unpublished (filed Aug. 19, 2011) (Fan Zhang).
U.S. Appl. No. 13/283,549, Unpublished (filed Oct. 27, 2011) (Wu Chang).
U.S. Appl. No. 13/296,022, Unpublished (filed Nov. 14, 2011) (Victor Krachkovsky).
U.S. Appl. No. 13/180,495, Unpublished (filed Jul. 11, 2011) (Chung-Li Wang).
U.S. Appl. No. 13/174,453, Unpublished (filed Jun. 30, 2011) (Johnson Yen).
U.S. Appl. No. 13/171,615, Unpublished (filed Jun. 29, 2011) (Bradley D. Seago).
U.S. Appl. No. 13/113,219, Unpublished (filed May 23, 2011) (Yang Han).
U.S. Appl. No. 13/284,767, Unpublished (filed Oct. 28, 2011) (Fan Zhang).
U.S. Appl. No. 13/269,852, Unpublished (filed Oct. 10, 2011) (Haitao Xia).
U.S. Appl. No. 13/227,416, Unpublished (filed Sep. 7, 2011) (Lei Chen).
U.S. Appl. No. 13/622,294, Unpublished (filed Sep. 18, 2012) (Fan Zhang).
U.S. Appl. No. 13/545,833, Unpublished (filed Jul. 10, 2012) (Zhi Bin Li).
U.S. Appl. No. 13/305,551, Unpublished (filed Nov. 28, 2011) (Yang Han).
U.S. Appl. No. 13/596,947, Unpublished (filed Aug. 28, 2012) (Fan Zhang).
U.S. Appl. No. 13/227,544, Unpublished (filed Sep. 8, 2011) (Shaohua Yang).
U.S. Appl. No. 13/597,001, Unpublished (filed Aug. 28, 2012) (Fan Zhang).
U.S. Appl. No. 13/619,907, Unpublished (filed Sep. 14, 2012) (Fan Zhang).
U.S. Appl. No. 13/621,341, Unpublished (filed Sep. 17, 2012) (Shaohua Yang).
U.S. Appl. No. 13/445,834, Unpublished (filed Apr. 12, 2012) (Chung-Li Wang).
U.S. Appl. No. 13/989,583, Unpublished (filed Oct. 15, 2012) (Shaohua Yang).
U.S. Appl. No. 13/596,819, Unpublished (filed Aug. 28, 2012) (Shaohua Yang).
U.S. Appl. No. 13/670,393, Unpublished (filed Nov. 6, 2012) (Lei Chen).
U.S. Appl. No. 13/777,841, Unpublished (filed Feb. 26, 2013) (Shu Li).
U.S. Appl. No. 13/777,976, Unpublished (filed Feb. 26, 2013) (Shu Li).
U.S. Appl. No. 13/777,381, Unpublished (filed Feb. 26, 2013) (Shaohua Yang).
U.S. Appl. No. 13/741,003, Unpublished (filed Jan. 14, 2013) (Lu Lu).
U.S. Appl. No. 13/873,224, Unpublished (filed Apr. 30, 2013) (Razmik Karabed).
U.S. Appl. No. 13/875,951, Unpublished (filed May 2, 2013) (Mikhail I Grinchuk).
U.S. Appl. No. 13/742,340, Unpublished (filed Jan. 15, 2013) (Razmik Karabed).
U.S. Appl. No. 13/597,026, Unpublished (filed Aug. 28, 2012) (Fan Zhang).
U.S. Appl. No. 13/305,510, Unpublished (filed Nov. 28, 2011) (Lei Chen).
U.S. Appl. No. 13/362,409, Unpublished (filed Jan. 31, 2012) (Fan Zhang).
U.S. Appl. No. 13/445,848, Unpublished (filed Apr. 12, 2012) (Bruce Wilson).
U.S. Appl. No. 13/412,520, Unpublished (filed Mar. 5, 2012) (Fan Zhang).
U.S. Appl. No. 13/596,978, Unpublished (filed Aug. 28, 2012) (Fan Zhang).
U.S. Appl. No. 13/316,741, Unpublished (filed Dec. 12, 2011) (Yang Han).
U.S. Appl. No. 13/363,751, Unpublished (filed Feb. 1, 2012) (Lei Chen).
U.S. Appl. No. 13/327,279, Unpublished (filed Dec. 15, 2011) (Wei Feng).
U.S. Appl. No. 13/340,974, Unpublished (filed Dec. 30, 2011) (Dan Liu).
U.S. Appl. No. 13/316,858, Unpublished (filed Dec. 12, 2011) (Zongwang Li).
U.S. Appl. No. 13/369,468, Unpublished (filed Feb. 9, 2012) (Zongwang Li).
U.S. Appl. No. 13/426,714, Unpublished (filed Mar. 22, 2012) (Shaohua Yang).
U.S. Appl. No. 13/295,150, Unpublished (filed Nov. 14, 2011) (Zongwang Li).
U.S. Appl. No. 13/300,078, Unpublished (filed Nov. 18, 2011) (Chung-Li Wang).
U.S. Appl. No. 13/372,580, Unpublished (filed Feb. 14, 2012) (Fan Zhang).
U.S. Appl. No. 13/422,986, Unpublished (filed Mar. 16, 2012) (Fan Zhang).
U.S. Appl. No. 13/433,693, Unpublished (filed Mar. 29, 2012) (Fan Zhang).
U.S. Appl. No. 13/445,878, Unpublished (filed Apr. 12, 2012) (Yu Liao).
U.S. Appl. No. 13/474,660, Unpublished (filed May 17, 2012) (Zongwang Li).
U.S. Appl. No. 13/302,119, Unpublished (filed Nov. 22, 2011) (Lei Chen).
U.S. Appl. No. 13/340,951, Unpublished (filed Dec. 30, 2011) (Lei Chen).

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

(56) References Cited

OTHER PUBLICATIONS

Weon-Cheol Lee et al., "Vitierbi Decoding Method Using Channel State Info. in COFDM System" IEEE Trans. on Consumer Elect., IEEE Service Center, NY, NY vol. 45, No. 3 08/99.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 7.

Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

US 9,048,867 B2

SHIFT REGISTER-BASED LAYERED LOW DENSITY PARITY CHECK DECODER

FIELD OF THE INVENTION

Various embodiments of the present invention provide systems and methods for data processing, and more particularly to systems and methods for low density parity check decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits may be used in error correction systems, including in Low Density Parity Check (LDPC) decoders.

BRIEF SUMMARY

Embodiments of the present inventions are related to systems and methods for decoding data in a low density parity check decoder having a shift register based check node unit. An apparatus for layered low density parity check decoding includes a variable node processor and a check node processor. The variable node processor is operable to generate variable node to check node messages and to calculate perceived data values based on check node to variable node messages. The check node processor includes an intermediate message generator circuit operable to generate intermediate check node messages, a shift register based memory operable to store the intermediate check node messages, and at least one check node to variable node message generator circuit operable to generate the check node to variable node messages based on the intermediate check node messages from the shift register based memory.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Embodiments of the present invention are related to a min-sum based layered low density parity check decoder with shift register based check node unit. Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
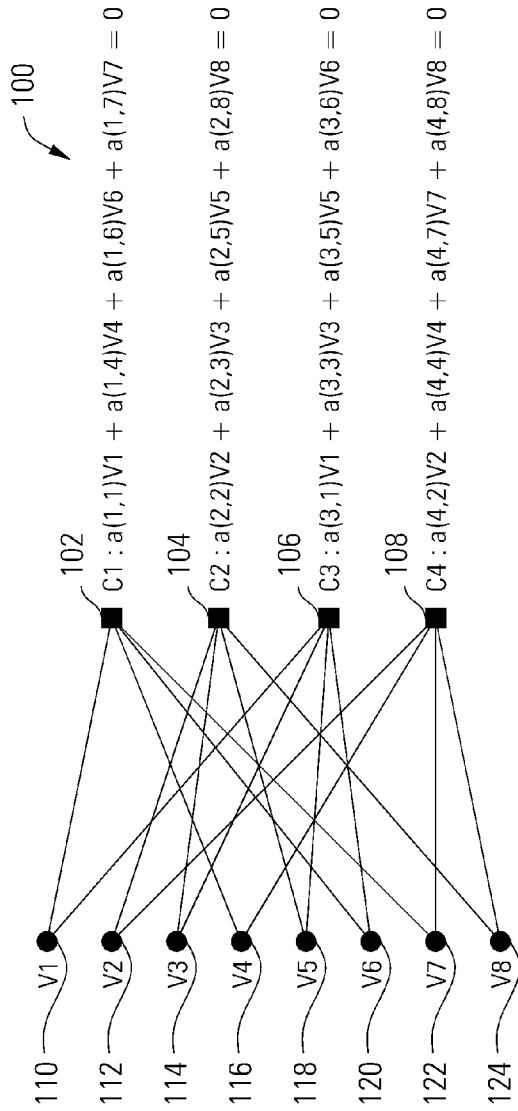
FIG. 1 depicts a Tanner graph of a simplified low density parity check code that may be decoded in a low density parity check decoder with a shift register based check node unit in accordance with some embodiments of the present inventions.

A low density parity check code is a parity-based code that can be visually represented in a Tanner graph 100 as illustrated in FIG. 1. In a low density parity check decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. Low density parity check decoders may be implemented in binary or non-binary fashion. In a binary low density parity check decoder, variable nodes 110-124 contain scalar values based on a group of data and parity bits that are retrieved from a storage device, received by a transmission system or obtained in some other way. Messages in the binary low density parity check decoders are scalar values transmitted as plain-likelihood probability values or log likelihood ratio (LLR) values representing the probability that the sending variable node contains a particular value. In a non-binary low density parity check decoder, variable nodes 110-124 contain symbols from a Galois Field, a finite field $GF(p^k)$ that contains a finite number of elements, characterized by size $p^k$ where p is a prime number and k is a positive integer. Messages in the non-binary low density parity check decoders are multi-dimensional vectors, generally either plain-likelihood probability vectors or log likelihood ratio vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,4) & 0 & a(1,6) & a(1,7) & 0 \\ 0 & a(2,2) & a(2,3) & 0 & a(2,5) & 0 & 0 & a(2,8) \\ a(3,1) & 0 & a(3,3) & 0 & a(3,5) & a(3,6) & 0 & 0 \\ 0 & a(4,2) & 0 & a(4,4) & 0 & 0 & a(4,7) & a(4,8) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example low density parity check code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the low density parity check code converges on a value for the group of data and parity bits in the variable nodes 110-124. For example, variable node 110 passes messages to check nodes 102 and 106, referred to herein as variable node to check node messages or V2C messages. Check node 102 passes messages back to variable nodes 110, 116, 120 and 122, referred to herein as check node to variable node messages or C2V messages. The messages between variable nodes 110-124 and check nodes 102-108 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

The shift register based check node unit in a min-sum based layered low density parity check decoder calculates intermediate check node messages based on variable node messages, including the minimum sub-message $min_1(d)$, the index $idx(d)$ of $min_1(d)$, and the sub-minimum or next minimum sub-message $min_2(d)$, or minimum of all sub-messages excluding $min_1(d)$, for each nonzero symbol d in the Galois Field based on all extrinsic messages from neighboring variable nodes. In other words, the sub-messages for a particular symbol d are gathered from messages from all extrinsic inputs, and the $min_1(d)$, $idx(d)$ and $min_2(d)$ is calculated based on the gathered sub-messages for that symbol d. For a Galois Field with q symbols, the check node will calculate the $min_1(d)$, $idx(d)$ and $min_2(d)$ sub-message for each of the q−1 non-zero symbols in the field except the most likely symbol.

The $min_1(d)$, $idx(d)$ and $min_2(d)$ values are stored in a shift register based structure, from which final check node messages $R_{new}$ and $R_{old}$ are generated. The use of the shift register based structure significantly improves a critical timing path in some embodiments of a layered low density parity check decoder.

Some embodiments of a multi-level layered low density parity check decoder use quasi-cyclic low density parity check codes in which the parity check H matrix is an array of circulant sub-matrices, cyclically shifted versions of identity matrices and null matrices with different cyclical shifts. In some embodiments, the H matrix is constructed based on the finite field GF(4), although other field sizes may be used, with M circulant rows and N circulant columns, and with each circulant being a b×b sub-matrix with the form:

$$B_{i,j} = \begin{bmatrix} 0 & \alpha^{j_{i,j}} & 0 & \cdots & 0 \\ 0 & 0 & \alpha^{j_{i,j}} & \cdots & 0 \\ \vdots & \vdots & \vdots & \ddots & \vdots \\ 0 & 0 & 0 & \cdots & \alpha^{j_{i,j}} \\ \alpha^{j_{i,j}} & 0 & 0 & \cdots & 0 \end{bmatrix}$$

In the multi-level layered low density parity check decoder, the parity check H matrix of the low density parity check code is partitioned into L layers, with the H matrix being processed row by row and the circulants being processed layer by layer. Each layer is processed column by column, processing non-zero entries (or circulants) in H-matrix columns. As the layers or rows are processed, the column results are updated based on each row result. Layered decoding can reduce the time to converge on a result in the decoder in some cases.

Figure 2:
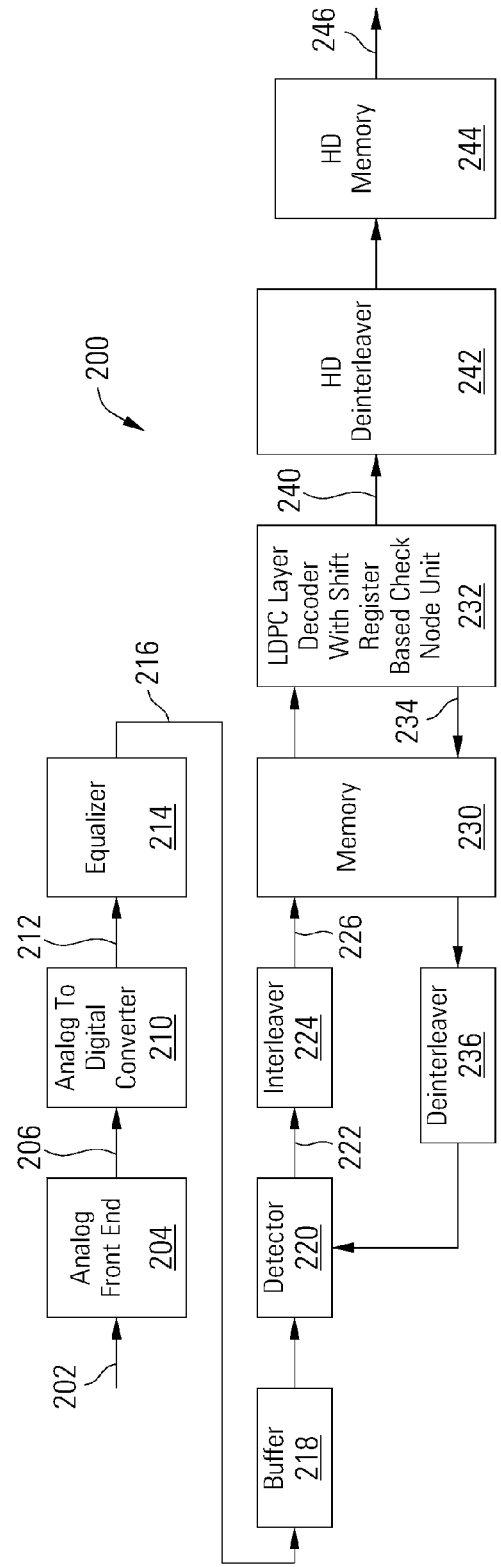
FIG. 2 depicts a block diagram of a read channel with a low density parity check decoder with a shift register based check node unit which may be used to retrieve or receive stored or transmitted data in accordance with some embodiments of the present invention.

Although the layered low density parity check decoder with shift register based check node unit disclosed herein is not limited to any particular application, several examples of applications are presented herein that benefit from embodiments of the present invention. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log likelihood ratio information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because low density parity check decoders are best suited to correcting errors that are more uniformly distributed, burst errors can overwhelm low density parity check decoders. The interleaver 224 prevents this by interleaving or shuffling the detected output 222 from data detector 220 to yield an interleaved output 226 which is stored in a memory 230. The interleaved output 226 from the memory 230 is provided to a layered low density parity check decoder with shift register based check node unit 232 which performs parity checks on the interleaved output 226, ensuring that parity constraints established by a low density parity check encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the low density parity check decoder 232.) To perform a global iteration, log likelihood ratio values 234 from the low density parity check decoder 232 are stored in memory 230, deinterleaved in a deinterleaver 236 to reverse the process applied by interleaver 224, and provided again to the data detector 220 to allow the data detector 220 to repeat the data detection process, aided by the log likelihood ratio values 234 from the low density parity check decoder 232. In this manner, the read channel 200 can perform multiple global iterations, allowing the data detector 220 and low density parity check decoder 232 to converge on the correct data values.

The low density parity check decoder 232 also produces hard decisions 240 about the values of the data bits or symbols contained in the interleaved output 226 of the interleaver 224. For binary data bits, the hard decisions may be represented as 0's and 1's. In a GF(4) low density parity check decoder, the hard decisions may be represented by four field elements 00, 01, 10 and 11.

The hard decisions 240 from low density parity check decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Figure 3:
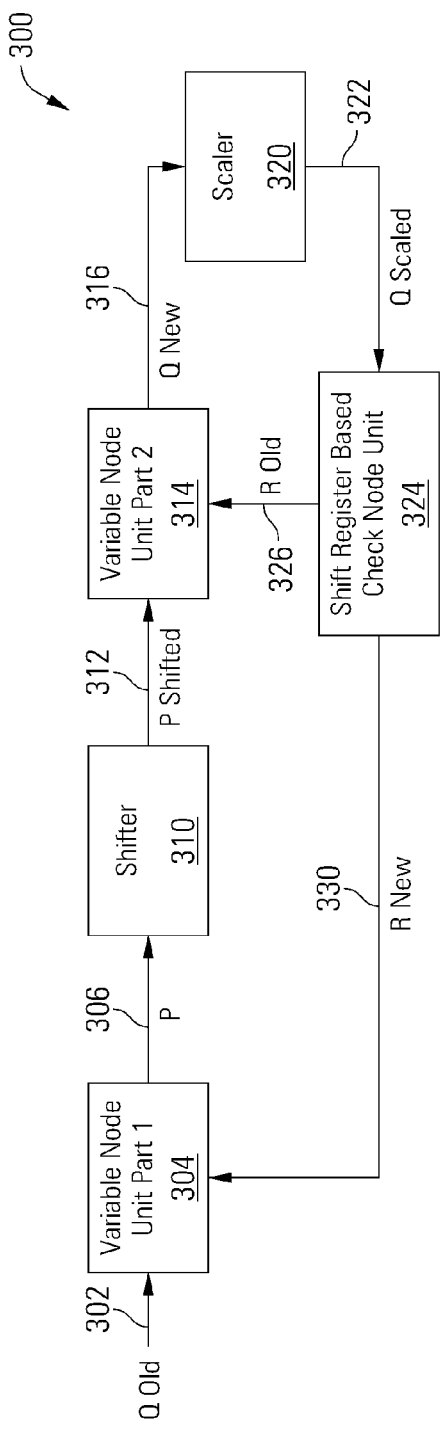
FIG. 3 depicts a block diagram of a layered low density parity check decoder with a shift register based check node unit in accordance with some embodiments of the present invention.

Turning to FIG. 3, a block diagram depicts a min-sum based layered low density parity check decoder 300 with shift register based check node unit 324 (also referred to herein as a check node processor) in accordance with some embodiments of the present invention. A variable node unit first portion 304 reads a Q old value 302, an incoming log likelihood ratio value for data to be decoded, adding the Q old value 302 for the previous layer to an R new value 330 to yield a P value 306 for the current layer. The variable node unit first portion 304 includes one or more adder circuits operable to add a Q old value 302 to a R new value 330. Based upon the disclosure provided herein, one of ordinary skill in the art will recognize a variety of circuitry that may be included as part of variable node unit first portion 304.

The P value 306 is provided to a shifter circuit 310 which shifts the P value 306 from the previous layer order to the current layer order, yielding shifted P value 312. The shifter circuit 310 in some embodiments is a cyclic shifter or barrel shifter which shifts the symbol values in the P value 306 to generate the shifted P value 312 as the next circulant submatrix. Based upon the disclosure provided herein, one of ordinary skill in the art will recognize a variety of shifter circuitry that may be included as part of shifter circuit 310.

The shifted P value 312 is provided to a variable node unit second portion 314 which is operable to subtract an R old value 326 for the current layer of a previous local decoding iteration from the shifted P value 312 to generate a Q new value 316 for the current layer. The variable node unit second portion 314 includes one or more subtractor circuits operable to subtract an R old value 326 from a shifted P value 312. Based upon the disclosure provided herein, one of ordinary skill in the art will recognize a variety of circuitry that may be included as part of variable node unit second portion 314. A scaler circuit 320 applies a scaling factor to the Q new value 316 to yield a Q scaled value 322.

The Q scaled value 322 comprises variable node to check node messages, soft information or log likelihood ratios about the probable values of each variable node for the codeword being decoded. A shift register based check node unit 324 processes the Q scaled value 322 to calculate check node messages, including an R new value 330 for the previous connected layer of the current decoding iteration and an R old value 326 for the current layer of the previous local decoding iteration.

Figure 4:
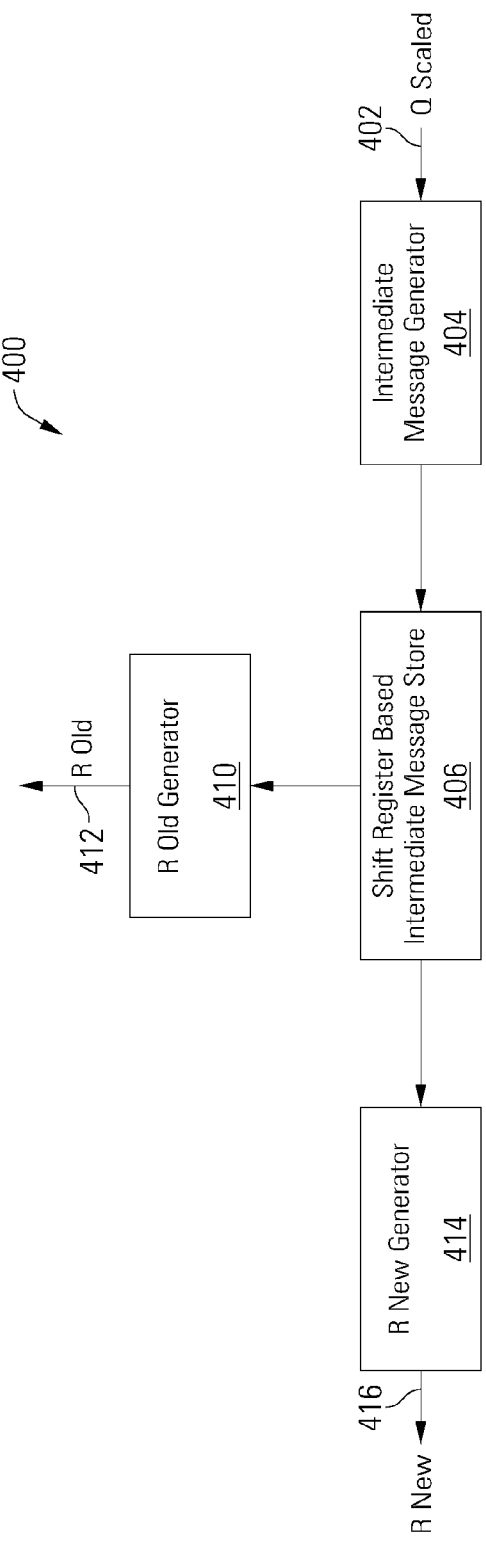
FIG. 4 depicts a block diagram of a shift register based check node unit in accordance with some embodiments of the present invention.

Turning to FIG. 4, an embodiment of a shift register based check node unit 400 is disclosed that is suitable for use in place of the shift register based check node unit 324 in some embodiments. An intermediate message generator 404 receives a Q scaled value 402, which contains variable node to check node messages, and generates intermediate check node messages for each layer which are stored in shift register based intermediate message store 406. The shift register based intermediate message store 406 contains several sets of registers to store the intermediate check node messages of multiple layers, and in some embodiments, of each layer in the H matrix. An R new generator circuit 414 selects the intermediate check node messages of the previous connected layer in the current local decoding iteration from shift register based intermediate message store 406 to calculate the R new value 416, which corresponds to R new value 330 when shift register based check node unit 400 is used in the layered low density parity check decoder 300 of FIG. 3. An R old generator circuit 410 selects the intermediate check node messages of the same layer in the previous local decoding iteration from shift register based intermediate message store 406 to calculate the R old value 412, which corresponds to R old value 326 when shift register based check node unit 400 is used in the layered low density parity check decoder 300 of FIG. 3.

In a min-sum based layered low density parity check decoder, the intermediate check node messages calculated by the intermediate message generator 404 are as below:

1. $min_1$, the first minimum variable node message (or scaled Q) of a given layer;
2. $min_2$, the next minimum variable node message (or scaled Q) of the given layer;
3. idx, the column index of the minimum $min_1$ variable node message of the given layer.

Figure 5:
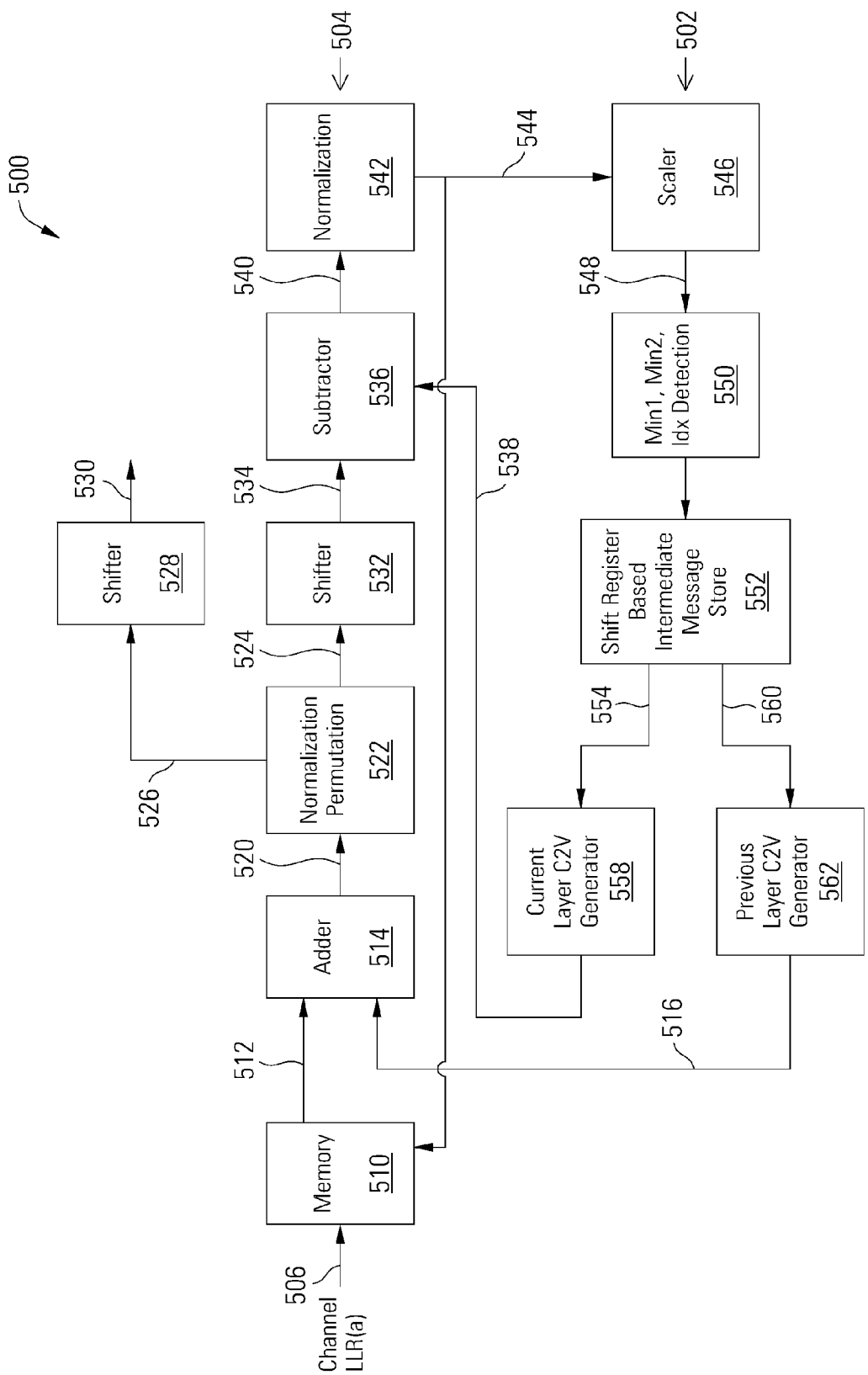
FIG. 5 depicts a block diagram of a layered low density parity check decoder with a shift register based check node unit in accordance with some embodiments of the present invention.

Turning to FIG. 5, a multi-level or binary layered low density parity check decoder 500 with a shift register based check node unit 502 is illustrated in block-diagram form in accordance with some embodiments of the present invention. The low density parity check decoder 500 generates check node to variable node messages from a shift register based check node unit 502 to a variable node processor 504 using min-sum based check node calculations. Incoming log likelihood ratio values for data to be decoded are received on an input 506 and stored in a Q value memory 510. The memory 510 stores soft log likelihood ratio input values from the input 506 and Q values of each symbol, representing the likelihood that an input symbol has the value of each element of the Galois Field. For a GF(4) low density parity check decoder, the Q values consist of one hard decision and three soft log likelihood ratio values, or four soft log likelihood ratio values in an equivalent but alternative format.

The memory 510 yields stored Q values 512 or $Q_n(a)$ for the layer previous to the layer currently being processed, also referred to herein as the previous layer and the connected layer. An adder 514 adds the Q values 512 to previous layer check node to variable node messages 516 or $R_{1,n}(a)$ in array fashion to produce S messages 520 or $S_n(a)$ containing total soft log likelihood ratio values for the previous layer. Again, columns in the H matrix represent variable nodes, and by adding all the non-zero entries in a column, the connected variable nodes are added to yield the input to a check node.

The S messages 520 are provided to a normalization and permutation circuit 522, which converts the format of the S messages 520 from four soft log likelihood ratio values to the equivalent content but different format of one hard decision and three soft log likelihood ratio values (for a GF(4) embodiment), and which applies a permutation to rearrange the variable node updated values to prepare for the check node update and to apply the permutations specified by the non-zero elements of the H matrix. For example, in a GF(4) embodiment, the four elements 0-3 of the Galois Field are 0, 1, $\alpha$, $\alpha^2$. The permutation applied by normalization and permutation circuit 522 is multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 5. Element $2 \times 5 = \alpha \times \alpha^2 = 1$, which is element 1. Thus, element 2 multiplied by 1, 2 and 5 results in elements 2, 5, and 1, which are permutations of elements 1, 2 and 5. The normalization and permutation circuit 522 yields P messages 524 or $P_n(a)$ for the previous layer. The normalization and permutation circuit 522 also yields soft log likelihood ratio values 526 which are provided to a cyclic shifter 528. Cyclic shifter 528 rearranges the soft log likelihood ratio values 526 to column order, performs a barrel shift which shifts the normalized soft log likelihood ratio values 526 from the previous layer to the current layer, and which yields hard decisions 530 or $a_n^*$, calculated as $argmin_a S_n(a)$.

The P messages 524 from the normalization and permutation circuit 522 are also provided to a shifter 532, a cyclic shifter or barrel shifter which shifts the symbol values in the normalized log likelihood ratio P messages 524 to generate the next circulant sub-matrix, yielding current layer P messages 534 which contain the total soft log likelihood ratio values of the current layer.

The current layer P messages 534 are provided to a subtractor 536 which subtracts the current layer check node to variable node messages 538, or $R_{2,n}(a)$, from the current layer P messages 534, yielding D messages 540, or $D_n(a)$. The current layer check node to variable node messages 538 are old values for the current layer, generated during a previous decoding iteration. Generally, the vector message from a check node to a variable node contains the probabilities for each symbol d in the Galois Field that the destination variable node contains that symbol d, based on the prior round variable node to check node messages from neighboring variable nodes other than the destination variable node. The inputs from neighboring variable nodes used in a check node to generate the check node to variable node message for a particular neighboring variable node are referred to as extrinsic inputs and include the prior round variable node to check node messages from all neighboring variable nodes except the particular neighboring variable node for which the check node to variable node message is being prepared, in order to avoid positive feedback. The check node prepares a different check node to variable node message for each neighboring variable node, using the different set of extrinsic inputs for each message based on the destination variable node. Subtracting the current layer check node to variable node messages 538 from an earlier iteration removes the intrinsic input, leaving only the extrinsic inputs to generate a check node to variable node message for a variable node.

D messages 540 are provided to a normalization circuit 542 which converts the format of the D messages 540 from four soft log likelihood ratio values to the equivalent content but different format of one hard decision and three soft log likelihood ratio values, yielding new Q messages 544, or $Q_{2,n}(a)$, also referred to as variable node to check node messages, for the current layer. The Q messages 544 are stored in memory 510, overwriting previous channel or calculated values for the current layer, and are also provided to a scaler 546 which scales the Q messages 544 to yield scaled variable node to check node messages 548, or $T_{2,n}(a)$.

Variable node to check node messages 548 are provided to an intermediate message generation circuit 550 which calculates the minimum value $min_1(d)$, second or next minimum value $min_2(d)$ and the index of the minimum value idx(d). The intermediate message generation circuit 550 also calculates the signs of the variable node to check node messages 548 and tracks the sign value of each non-zero element of the H matrix and the cumulative sign for the current layer. The intermediate message generation circuit 550 yields the current layer minimum, next minimum and index values with the sign values to a shift register based intermediate message store 552. A current layer check node to variable node generator 558 receives intermediate messages 554 from shift register based intermediate message store 552 and calculates the current layer check node to variable node messages 538, or $R_{2,n}(a)$. A previous layer check node to variable node generator 562 receives intermediate messages 560 from shift register based intermediate message store 552 and calculates the previous layer check node to variable node messages 516, or $R_{1,n}(a)$. In some embodiments, the current layer check node to variable node generator 558 and previous layer check node to variable node generator 562 generate the check node to variable node or R messages 538 and 516 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

The variable node processor 504 and the shift register based check node unit 502 thus operate together to perform layered decoding of non-binary or multi-level data. The variable node processor 504 generates variable node to check node messages (V2C messages) and calculates perceived values based on check node to variable node messages (check node to variable node messages). The shift register based check node unit 502 generates check node to variable node messages and calculates checksums based on variable node to check node messages, using an intermediate message generation circuit operable to identify a minimum, a next minimum and an index of minimum value in the variable node to check node messages, and a shift register based intermediate message store that facilitates generation of R values from the intermediate messages without requiring complex multiplexer and de-multiplexer structures.

Figure 6:
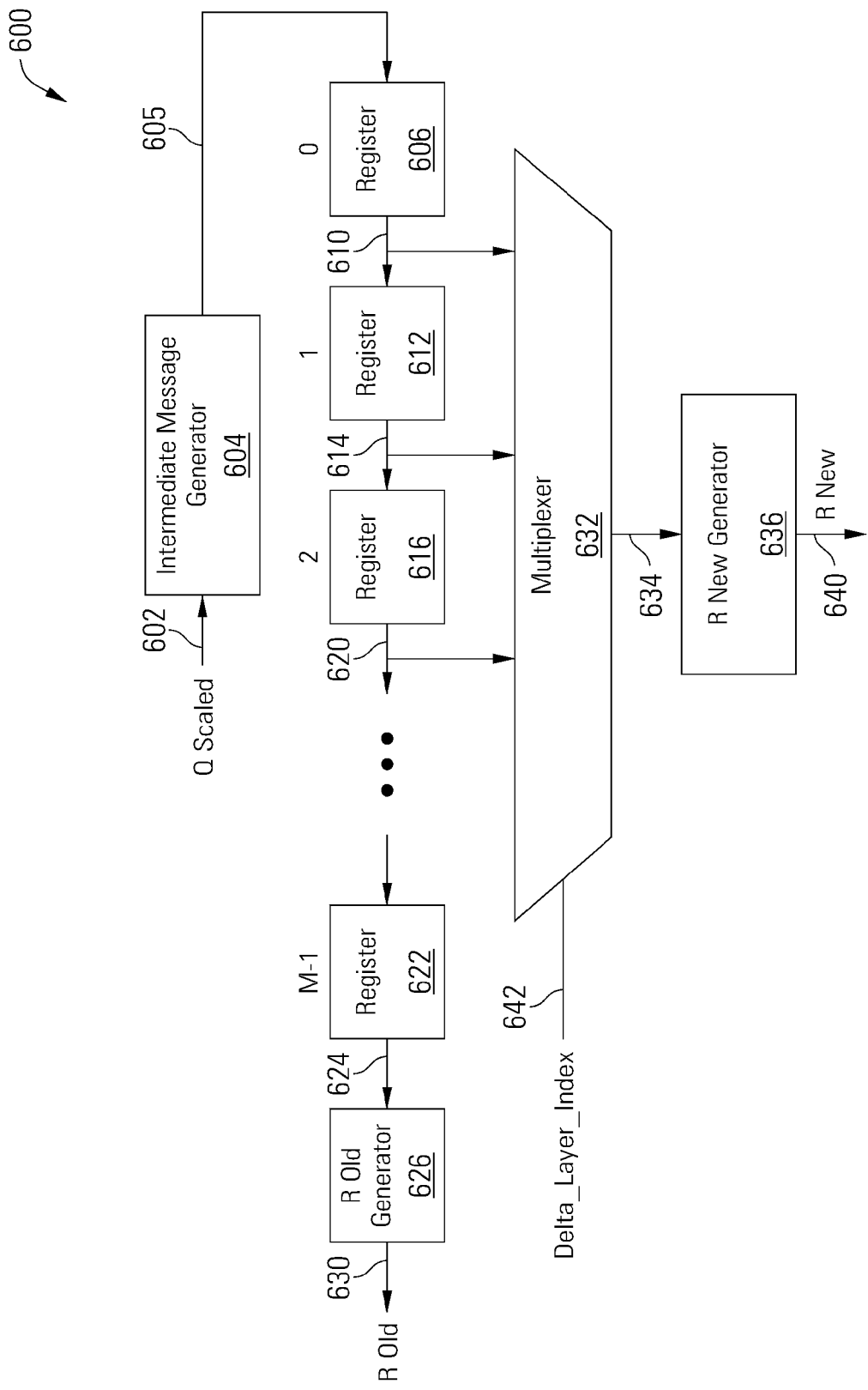
FIG. 6 depicts a block diagram of a shift register based intermediate message store in accordance with some embodiments of the present invention.

Turning now to FIG. 6, a block diagram of a shift register based intermediate message store 600 suitable for use in place of shift register based intermediate message store 406 or shift register based intermediate message store 552 is disclosed in accordance with some embodiments of the present invention. Within the shift register based check node architecture disclosed herein, intermediate check node message generation and selection of intermediate messages to form R new and R old messages can be performed in any suitable fashion, such as that disclosed in U.S. patent application Ser. No. 13/180, 495, filed Jul. 11, 2011 for a "Min-Sum Based Non-Binary LDPC Decoder", which is incorporated herein by reference for all purposes. The R old generator circuit 626 and R new generator circuit 636 are assisted by the shift register sets and multiplexer 632 to select the proper min1/min2/index values from various layers and decoding iterations to yield the R old value 630 and R new value 640. The R old generator circuit 626 generates the R old value 630 for the current layer of the circulant being processed, and the R new generator circuit 636 generates the R new value 640 for the previous connected layer of the circulant being processed. If the current column index is equal to the index of the minimum value, then the value of R is the min2 second minimum value. Otherwise, the value of R is the min1 minimum value of that layer.

Intermediate messages 605 generated in an intermediate message generator 604 from Q scaled values 602 are passed into a first set of registers 606 at the end of the first layer. The output 610 of the first set of registers 606 is passed into a second set of registers 612 at the end of the second layer. The output 614 of the second set of registers 612 is passed into a third set of registers 616 at the end of the third layer, and so on, in shifted manner, such that the register sets (e.g., 606, 612, 616) form shift registers. The number of sets of registers needed in this check node process unit 600 is the same as the number of layers in the low density parity check matrix. Additional sets of registers may be included if the total layer number is larger than three, with the output (e.g., 620) of the penultimate set of registers (e.g., 616) being passed into the last set of registers 622. An R old generator circuit 626 generates or selects an R old value 630 based on the output 624 of the last set of registers 622. In other words, the R old generator circuit 626 selects the min1/min2/index value of the last set of registers to calculate or contain R old.

A multiplexer 632 selects outputs 610, 614, 620 of register sets 606, 612, 616 etc through the output 620 of the penultimate set of registers 616, based on a selector input 642. The size of the multiplexer 632 is determined by the maximum distance of adjacent circulants in the same column in the H matrix, which is smaller than the total number of layers in the H matrix. An R new generator circuit 636 produces the R new value 640 based on the output 634 of the multiplexer 632. Based upon the disclosure provided herein, one of ordinary skill in the art will recognize a variety of circuitry that may be included as part of intermediate message generator 604 and R old generator circuit 626 and R new generator circuit 636.

To illustrate the operation of the shift register based intermediate message store 600, consider an H matrix with three layers circulants 0-3 in four columns as follows, where X's indicate non-zero circulants:

|         | Circulant 0 | Circulant 1 | Circulant 2 | Circulant 3 |
|---------|-------------|-------------|-------------|-------------|
| Layer 0 | X           | X           | X           | 0           |
| Layer 1 | X           | 0           | X           | X           |
| Layer 2 | X           | X           | 0           | X           |

According to the layered low density parity check decoding algorithm, R new of the first non-zero circulant in each column in the first local decoding iteration and R old of all layers in the first local decoding iteration should be 0. For example, R new of circulants 0, 1 and 2 in layer 0 and of circulant 3 in layer 1 should be 0 in the first local decoding iteration, and R old of all circulants in all layers should be 0 in the first local decoding iteration.

When the decoder processes the circulants in layer 0 in the first local iteration, the initial value of R new should be 0 for the first layer and R old of all layers is 0 for the first local iteration. At the end of the first layer, the min1/min2/index values (or intermediate messages) of layer 0 has been generated by intermediate message generator 604 and is stored in the first set of registers 606.

When the decoder processes the circulants in layer 1 in the first local iteration, the min1/min2/index values of layer 0 for circulant 0 and circulant 2, the circulants that are connected between layers 0 and 1, or that both have non-zero entries in layers 0 and 1, are selected to generate the R new value. The selector input 642 for the multiplexer 632 is therefore set at delta_layer_index=current_layer_index−previous_layer_index−1=1−0−1=0. Thus, R old of the first local iteration is 0. At the end of the second local iteration, the min1/min2/index values of layer 0 have been shifted to the second set of registers 612 and the min1/min2/index values of layer 1 have been generated and stored in the first set of registers 606.

When the decoder processes the circulants in layer 2 in the first local iteration, if the previous connected circulant is in layer 1 (circulant 0, circulant 3), the min1/min2/index value of layer 1 (now stored in the first set of registers 606) should be selected to generate the R new value 640, such that delta_layer_index 642=current_layer_index−previous_layer_index−1=1−0−1=0. If the previous connected circulant is in layer 0 (circulant 1), the min1/min2/index value of layer 0 (now stored in the second set of registers 612) should be selected to generate the R new value 640, such that delta_layer_index 642=current_layer_index−previous_layer_index−1=2−0−1=1. R old of the first local iteration is 0. At the end of the second layer, the min1/min2/index values of layer 0 have been shifted to the third set of registers 616, the min1/min2/index values of layer 1 have been shifted to the second set of registers 612 and the min1/min2/index values of layer 2 have been generated and stored in the first set of registers 606.

When the decoder processes the circulants in layer 0 in the second local iteration, if the previous connected circulant is in layer 2 (circulant 0, circulant 1), the min1/min2/index value of layer 2 (now stored in the first set of registers 606) should be selected to generate the R new value 640. Because the current_layer_index is smaller than the previous_layer_index in this case, delta_layer_index 642 is calculated as max_layer_number+current_layer_index−previous_layer_index−1=3+current_layer_index−previous_layer_index−1=3+0−2−1=0. If the previous connected circulant is in layer 1 (circulant 2), the min1/min2/index value of layer 1 (now stored in the second set of registers 612) should be selected to generate the R new value 640, such that delta_layer_index 642=max_layer_number+current_layer_index−previous_layer_index−1=3+0−1−1=1. The min1/min2/index values of layer 0 of the first local iteration should be used for R old generation, which are stored in the last set of registers 622, or in the third set of registers 616 in this example with a three layer H matrix. (The total number of sets of registers is the same as the total number of layers in the H matrix, so in this example with an H matrix with three layers, register 616 is the last set of registers and register set 622 is omitted.) At the end of layer 0 in the second local iteration, the min1/min2/index values of layer 1 of the first local iteration have been shifted to the third set of registers 616, the min1/min2/index values of layer 2 of the first local iteration have been shifted to the second set of registers 612 and the min1/min2/index values of layer 0 of the second local iteration have been generated and stored in the first set of registers 606.

When the decoder processes the circulants in layer 1 in the second local iteration, if the previous connected circulant is in layer 0 (circulant 0, circulant 2), the min1/min2/index value of layer 0 of the second local iteration (now stored in the first set of registers 606) should be selected to generate the R new value 640, such that delta_layer_index 642=current_layer_index−previous_layer_index−1=current_layer_index−previous_layer_index−1=1−0−1=0. If the previous connected circulant is in layer 2 (circulant 3), the min1/min2/index value of layer 2 of the first local iteration (now stored in the second set of registers 612) should be selected to generate the R new value 640, such that delta_layer_index 642=max_layer_number+current_layer_index−previous_layer_index−1=3+1−2−1=1. The min1/min2/index values of layer 1 of the first local iteration should be used for R old generation, which are stored in the last set of registers 622, or in the third set of registers 616 in this example with a three layer H matrix. At the end of the layer, the min1/min2/index values of layer 2 of the first local iteration have been shifted to the third set of registers 616, the min1/min2/index values of layer 0 of the second local iteration have been shifted to the second set of registers 612 and the min1/min2/index values of layer 1 of the second local iteration have been generated and stored in the first set of registers 606.

When the decoder processes the circulants in layer 2 in the second local iteration, if the previous connected circulant is in layer 1 (circulant 0, circulant 3), the min1/min2/index value of layer 1 of the second local iteration (now stored in the first set of registers 606) should be selected to generate the R new value 640, such that delta_layer_index 642=current_layer_index−previous_layer_index−1=current_layer_index−previous_layer_index−1=2−1−1=0. If the previous connected circulant is in layer 0 (circulant 1), the min1/min2/index value of layer 0 of the second local iteration (now stored in the second set of registers 612) should be selected to generate the R new value 640, such that delta_layer_index 642=current_layer_index−previous_layer_index−1=2−0−1=1. The min1/min2/index values of layer 2 of the first local iteration should be used for R old generation, which are stored in the last set of registers 622, or in the third set of registers 616 in this example with a three layer H matrix. At the end of the layer, the min1/min2/index values of layer 0 of the second local iteration have been shifted to the third set of registers 616, the min1/min2/index values of layer 1 of the second local iteration have been shifted to the second set of registers 612 and the min1/min2/index values of layer 2 of the second local iteration have been generated and stored in the first set of registers 606.

In the shift register based intermediate message store 600, no de-multiplexer is needed to write the intermediate check node information. The size of the multiplexer 632 for R new generation is determined by the maximum layer index delta (from the current_layer_index to the previous_layer_index) in the H matrix.

Figure 7:
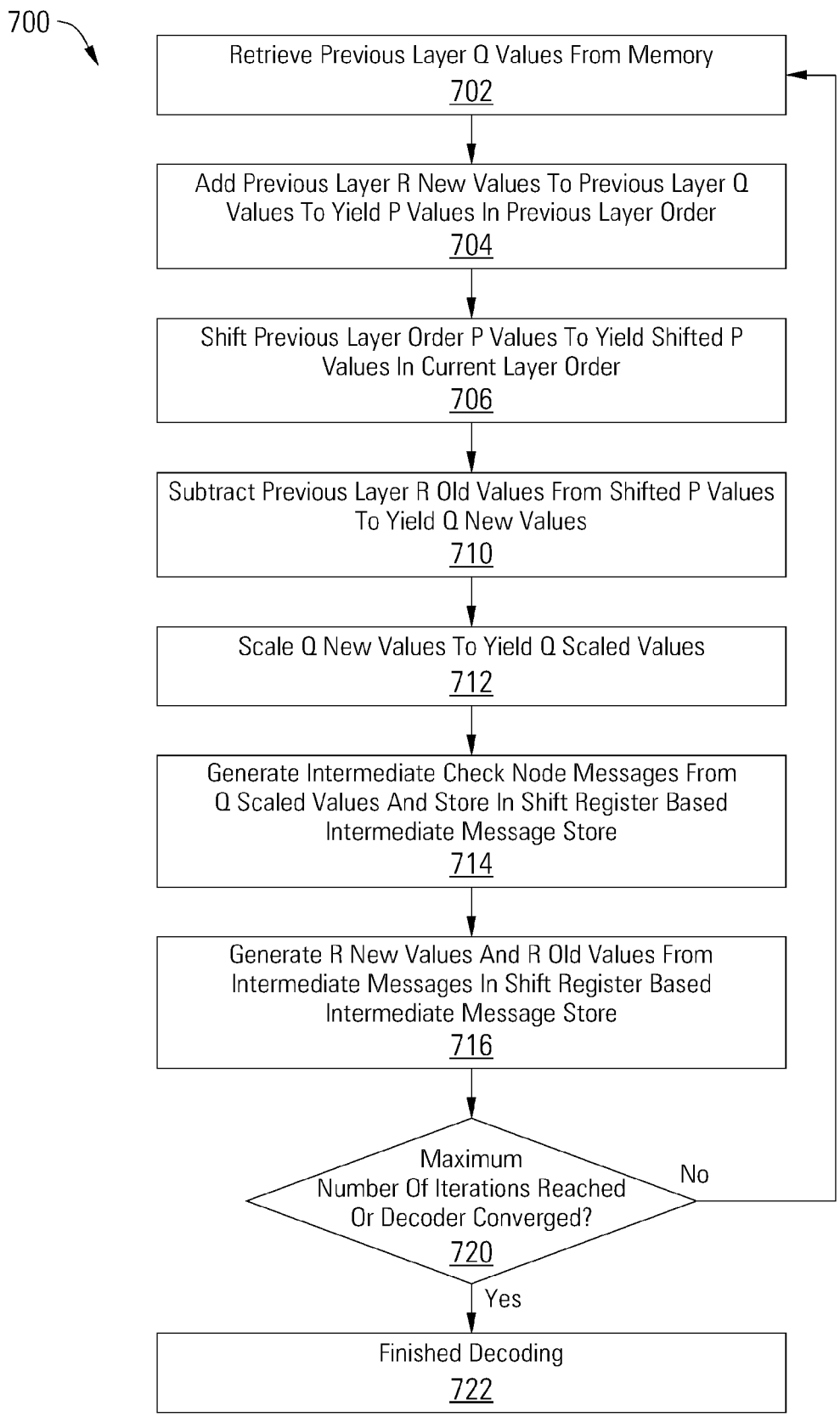
FIG. 7 depicts a flow diagram of an operation for decoding in a layered low density parity check decoder with a shift register based check node unit in accordance with some embodiments of the present invention.

Turning to FIG. 7, a flow diagram 700 depicts a method for decoding in a layered low density parity check decoder with a shift register based check node unit in accordance with some embodiments of the present invention. The method of FIG. 7, or variations thereof, may be performed in data decoding circuits such as those illustrated in FIGS. 3-6. Following flow diagram 700, previous layer Q values are retrieved from memory. (Block 702) Previous layer R new values are added to the previous layer Q values to yield P values in the previous layer order. (Block 704) The previous layer order P values are shifted to yield shifted P values in the current layer order. (Block 706) Previous layer R old values are subtracted from the shifted P values to yield Q new values. (Block 710) The Q new values are scaled to yield Q scaled values. (Block 712) Intermediate check node messages are generated from the Q scaled values and are stored in a shift register intermediate message store. (Block 714) In some embodiments, the intermediate check node messages are min1/min2/index values for layers of an H matrix. R new values and R old values are generated from the intermediate messages in the shift register based intermediate message store. (Block 716) A determination is made as to whether decoding has converged or whether the maximum number of local decoding iterations has been reached. (Block 720). If so, decoding is finished. (Block 722) Otherwise, decoding continues. (Block 702).

Figure 8:
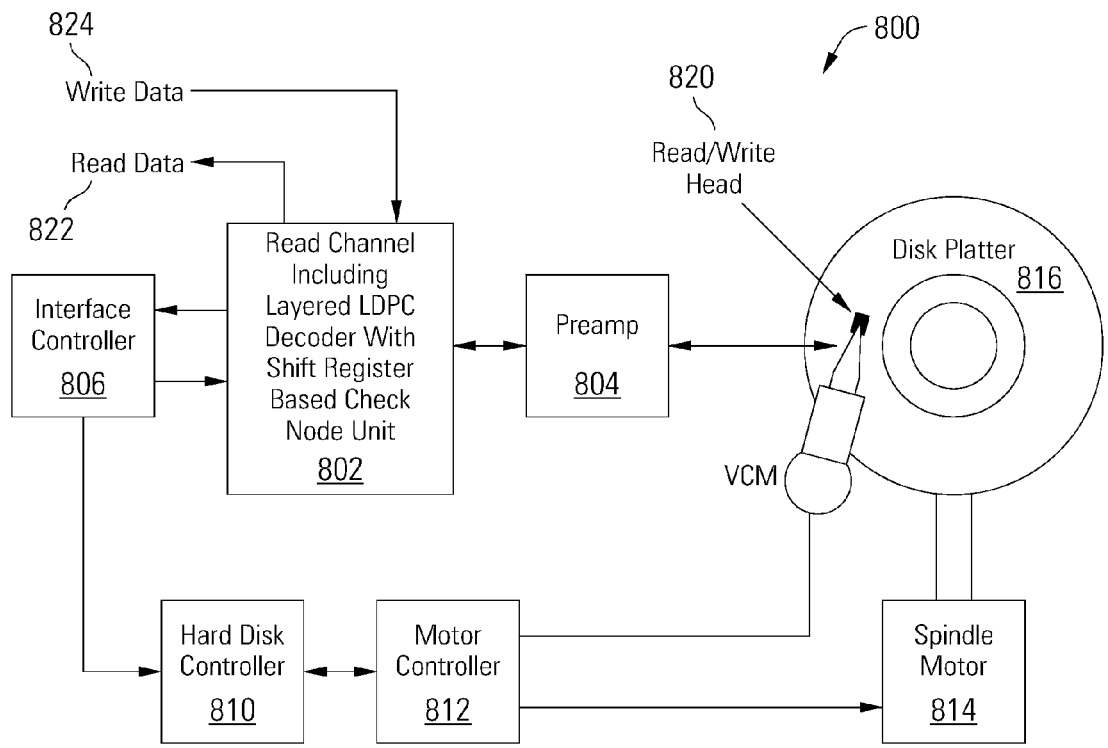
FIG. 8 depicts a storage system including a data processing circuit with a layered low density parity check decoder with a shift register based check node unit in accordance with some embodiments of the present invention.
Figure 9:
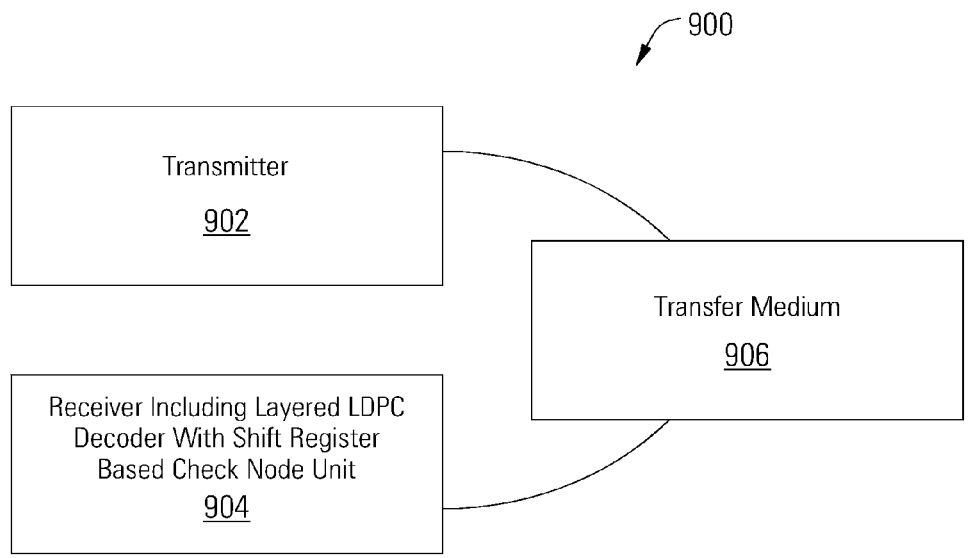
FIG. 9 depicts a wireless communication system including a data processing circuit with a layered low density parity check decoder with a shift register based check node unit in accordance with some embodiments of the present invention.

Although the shift register based low density parity check decoder disclosed herein is not limited to any particular application, several examples of applications are presented in FIGS. 8 and 9 that benefit from embodiments of the present invention. Turning to FIG. 8, a storage system 800 is illustrated as an example application of a shift register based low density parity check decoder in accordance with some embodiments of the present invention. The storage system 800 includes a read channel circuit 802 with a shift register based low density parity check decoder in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of processing the received information, read channel circuit 802 performs a data decoding process on the received signal using a shift register based low density parity check decoder. Such a shift register based low density parity check decoder may be implemented consistent with the disclosure above in relation to FIGS. 3-6. In some cases, the data decoding may be performed consistent with the flow diagram disclosed above in relation to FIG. 7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 9, a wireless communication system 900 or data transmission device including a transmitter 902 and receiver 904 with a shift register based low density parity check decoder is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a shift register based low density parity check decoder. Such a shift register based low density parity check decoder may be implemented consistent with the disclosure above in relation to FIGS. 3-6. In some cases, the data decoding may be performed consistent with the flow diagram disclosed above in relation to FIG. 7.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as dynamic random-access memory, negated-AND flash, negated-OR flash, other non-volatile memories and solid state drives.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present inventions provide novel systems, devices, methods and arrangements for a shift register based low density parity check decoder. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for layered low density parity check decoding comprising:
    a variable node processor operable to generate variable node to check node messages and to calculate perceived data values based on check node to variable node messages; and
    a check node processor comprising an intermediate message generator circuit operable to generate intermediate check node messages comprising a minimum, a next minimum and an index of minimum value in the variable node to check node messages, a shift register based memory operable to store the intermediate check node messages, and at least one check node to variable node message generator circuit operable to generate the check node to variable node messages based on the intermediate check node messages from the shift register based memory, wherein the minimum, the next minimum and the index of minimum value are selected for the at least one check node to variable node message generator circuit at least in part by the shift register.

2. The apparatus of claim 1, wherein the shift register based memory comprises a series of register sets.

3. The apparatus of claim 2, wherein each of the register sets comprises a register operable to store a minimum value, a second register to store a next minimum value, and a third register to store an index of the minimum value for the variable node to check node messages for a layer of an H matrix.

4. The apparatus of claim 2, wherein a total number of the sets of registers in the shift register based memory is equal to a number of layers in an H matrix for a layered low density parity check code associated with the variable node processor and the check node processor.

5. The apparatus of claim 2, wherein the shift register based memory further comprises a first output at an end of the series of register sets, wherein the first output is connected to an R old generator in the at least one check node to variable node message generator circuit, wherein an R old value comprises one of the check node to variable node messages for a current layer computed based on the variable node to check node messages from a previous decoding iteration.

6. The apparatus of claim 5, wherein the shift register based memory further comprises a multiplexer comprising a plurality of inputs each connected to an output of one of the series of register sets, and a second output at an output of the multiplexer, wherein the second output is connected to an R new generator in the at least one check node to variable node message generator circuit, wherein an R new value comprises one of the check node to variable node messages for a previous layer based on the variable node to check node messages from a current decoding iteration.

7. The apparatus of claim 6, further comprising a control input to the multiplexer, wherein the control input to the multiplexer is operable to select a value based on an index of a connected circulant in a current layer and an index of a connected circulant in a previous layer.

8. The apparatus of claim 1, wherein the at least one check node to variable node message generator circuit comprises a first circuit operable to generate one of the check node to variable node messages for a previous layer from a current decoding iteration and a second circuit operable to generate one of the check node to variable node messages for a current layer from a previous decoding iteration.

9. The apparatus of claim 1, wherein the variable node processor comprises an adder operable to add Q values to R new values in the check node to variable node messages for a previous layer to yield P values, wherein the Q values comprise perceived values of variable nodes, and wherein the R new values comprise the check node to variable node messages for a previous layer computed based on the variable node to check node messages from a current decoding iteration.

10. The apparatus of claim 9, wherein the variable node processor further comprises a shifter operable to shift the P values from a previous layer order to a current layer order to yield shifted P values.

11. The apparatus of claim 10, wherein the variable node processor further comprises a subtractor circuit operable to subtract R old values in the check node to variable node messages for a current layer from the shifted P values to yield Q new values in the variable node to check node messages, wherein the R old values comprise the check node to variable node messages for a current layer computed based on the variable node to check node messages from a previous decoding iteration.

12. The apparatus of claim 1, further comprising a scaler circuit operable to scale the variable node to check node messages.

13. The apparatus of claim 1, wherein the apparatus is implemented as an integrated circuit.

14. The apparatus of claim 1, wherein the apparatus is incorporated in a storage device.

15. The apparatus of claim 1, wherein the apparatus is incorporated in a storage system comprising a redundant array of independent disks.

16. The apparatus of claim 1, wherein the apparatus is incorporated in a data transmission device.

17. A method of decoding data in a low density parity check layer decoder, comprising:
    generating variable node to check node messages based on check node to variable node messages for a current layer and a previous layer;
    generating intermediate check node messages based on the variable node to check node messages, wherein the intermediate check node messages comprise a minimum, a next minimum and an index of minimum value from the variable node to check node messages;
    storing the intermediate check node messages in a shift register based memory;
    generating the check node to variable node messages based on the intermediate check node messages from the shift register based memory, comprising using the shift register based memory to select the minimum, the next minimum and the index of minimum value; and
    calculating perceived data values based on the check node to variable node messages.

18. The method of claim 17, wherein generating the check node to variable node messages based on the intermediate check node messages from the shift register based memory comprise shifting the intermediate check node messages through sets of registers in the shift register based memory and selecting values from the sets of registers with a multiplexer.

19. A storage system comprising:

a magnetic storage medium maintaining a data set;

a read head operable read the data set from the storage medium; and a low density parity check layer decoder configured to decode digital data derived from an analog signal from the read head, comprising:

a variable node processor operable to generate variable node to check node messages based on check node to variable node messages; and a check node processor comprising an intermediate message generator circuit operable to generate intermediate check node messages comprising a minimum, a next minimum and an index of minimum value in the variable node to check node messages, a shift register based memory operable to store the intermediate check node messages, and at least one check node to variable node message generator circuit operable to generate the check node to variable node messages based on the intermediate check node messages from the shift register based memory, wherein the minimum, the next minimum and the index of minimum value are selected for the at least one check node to variable node message generator circuit at least in part by the shift register.

20. The storage system of claim 19, further comprising a scaler circuit operable to scale the variable node to check node messages.

* * * * *